United States Patent
Wu et al.

(10) Patent No.: US 8,971,060 B2
(45) Date of Patent: Mar. 3, 2015

(54) METHOD AND APPARATUS FOR CONTROLLING A SWITCHING MODE POWER SUPPLY DURING TRANSITION OF LOAD CONDITIONS TO MINIMIZE INSTABILITY

(75) Inventors: Quanqing Wu, Shanghai (CN); Xuegang Ren, Shanghai (CN); Zhao Xiangyuan, Shanghai (CN)

(73) Assignee: BCD Semiconductor Manufacturing Limited, Shanghai (CN)

( * ) Notice: Subject to any disclaimer, the term of this patent is extended or adjusted under 35 U.S.C. 154(b) by 769 days.

(21) Appl. No.: 12/648,799

(22) Filed: Dec. 29, 2009

(65) Prior Publication Data
US 2011/0019446 A1      Jan. 27, 2011

(30) Foreign Application Priority Data
Jul. 22, 2009   (CN) ...................... 2009 2 0163199 U (51) Int. Cl.
*H02M 3/335*   (2006.01)
*H03K 7/08*    (2006.01)
*H02M 1/00*    (2006.01)

(52) U.S. Cl.
CPC ............. *H02M 3/33523* (2013.01); *H03K 7/08* (2013.01); *H02M 2001/0035* (2013.01); *Y02B 70/16* (2013.01)
USPC .................... 363/21.12; 363/21.13; 363/21.15

(58) Field of Classification Search
CPC ............ H02M 7/23; H02M 7/25; H02M 7/02
USPC .............. 363/20, 21.04, 21.05, 21.07, 21.08, 363/21.09, 21.1, 21.12, 21.13, 21.15, 21.16, 363/21.17, 21.18, 79
See application file for complete search history.

(56) References Cited

U.S. PATENT DOCUMENTS

| | | | |
|---|---|---|---|
| 5,959,851 A * | 9/1999 | Shutts | 363/21.18 |
| 6,800,961 B2 * | 10/2004 | Basso | 307/43 |
| 6,836,415 B1 * | 12/2004 | Yang et al. | 363/21.01 |
| 7,057,310 B2 * | 6/2006 | Liu et al. | 307/126 |
| 7,573,251 B2 * | 8/2009 | Yang et al. | 323/303 |
| 2004/0257839 A1 * | 12/2004 | Yang et al. | 363/21.12 |
| 2006/0171179 A1 * | 8/2006 | Hall et al. | 363/95 |
| 2009/0015228 A1 * | 1/2009 | Sato et al. | 323/283 |
| 2010/0002480 A1 * | 1/2010 | Huynh et al. | 363/90 |
| 2011/0051472 A1 * | 3/2011 | Zhang et al. | 363/21.18 |

* cited by examiner

*Primary Examiner* — Emily P Pham (57) ABSTRACT

A controller for a switched mode power supply (SMPS) is provided. The SMPS is equipped with a transformer having a primary side winding, a secondary winding, and an auxiliary winding. The controller includes a detection circuit for detecting a transition from a first output load condition to a second output load condition of the SMPS and a control circuit coupled to the detection circuit and being configured to output one or more control signals in response to the detected output load transition. Depending on the embodiment, the one or more control signals include a first control signal for turning on a power switch to cause a current flow in a primary winding of the SMPS and/or one or more second control signals for turning off one or more functional circuit blocks in the controller.

18 Claims, 9 Drawing Sheets

METHOD AND APPARATUS FOR CONTROLLING A SWITCHING MODE POWER SUPPLY DURING TRANSITION OF LOAD CONDITIONS TO MINIMIZE INSTABILITY

CROSS-REFERENCES TO RELATED APPLICATIONS

This application claims priority to Chinese Patent Application No. 200920163199.4 filed Jul. 22, 2009 by inventors Quanqing Wu, et. al., commonly assigned and incorporated in its entirety by reference herein for all purposes.

BACKGROUND OF THE INVENTION

Embodiments of the present invention are directed to power supply control circuits and power supply systems. More particularly, embodiments of the present invention provide methods and circuits for controlling a switching mode power supply (SMPS). Merely as an example, the methods and circuits have been applied in controlling an SMPS during a transition of load conditions. But embodiments of the invention have a much wider applicability.

Regulated power supplies are indispensable in modern electronics. For example, the power supply in a personal computer often needs to receive power input from various outlets. Desktop and laptop computers often have regulated power supplies on the motherboard to supply power to the CPU, memories, and periphery circuitry. Regulated power supplies are also used in a wide variety of applications, such as home appliances, automobiles, and portable chargers for mobile electronic devices, etc.

In general, a power supply can be regulated using a linear regulator or a switching mode controller. A linear regulator maintains the desired output voltage by dissipating excess power. In contrast, a switching mode controller rapidly switches a power transistor on and off with a variable duty cycle or variable frequency and provides an average output that is the desired output voltage.

Compared with linear regulators, switching mode power supplies have the advantages of smaller size, higher efficiency and larger output power capability. On the other hand, they also have the disadvantages of greater noise, especially Electromagnetic Interference at the power transistor's switching frequency or its harmonics.

Pulse Width Modulation (PWM) and Pulse Frequency Modulation (PFM) are two control architectures of switching mode power supplies. In recent years, green power supplies are emphasized, which require higher conversion efficiency and lower standby power consumption. In a PWM controlled switching mode power supply, the system can be forced to enter into burst mode in standby conditions to reduce power consumption. In a PFM controlled switching mode power supply, the switching frequency can be reduced in light load conditions. PFM-controlled switching mode power supply exhibits simple control topology and small quiescent current. Therefore, it is suitable for low cost small output power applications such as battery chargers and adapters.

Even though widely used, conventional SMPS has many limitations. For example, during transition of different output load conditions, especially during relatively large load changes, the SMPS may exhibit unstable output voltages, as described in more detail below.

Therefore, there is a need for techniques that can provide more effective control of a switching mode power supply.

BRIEF SUMMARY OF THE INVENTION

The present invention provides devices and methods for controlling the output voltage of a switching mode power supply. Merely as an example, the methods and circuits have been applied in controlling an SMPS during a transition of load conditions.

In an embodiment, a controller according to the invention includes a detection circuit for detecting a change in the output load condition from a heavy load to a light load and a control circuit that disables certain functional blocks of the controller in response to the detected load change in order to reduce the current drain of the controller. It has been observed that by reducing the current drain of the controller during the light load condition, instability at the supply voltage of the controller can be minimized. In another embodiment, the instability can be reduced by supplying more power to the output.

In another embodiment of the present invention, a controller device includes a comparator having an input for receiving a feedback signal and configured to compare the feedback signal with a reference voltage. The result of the comparison is then delayed in a delay circuit, and the delayed control signal is then used to turn on and off a high voltage source in order to increase the charging rate of the power supply of the controller device and to compensate for the current drain when the power switch remains inactive.

Some embodiments of the present invention provide a controller for a switched mode power supply (SMPS) equipped with a transformer having a primary side winding, a secondary winding, and an auxiliary winding. The controller has a detection circuit for detecting a transition from a first output load condition to a second output load condition of the SMPS, and a control circuit coupled to the detection circuit and configured to output one or more control signals in response to the detected output load transition. The one or more control signals includes a first control signal for turning on a power switch to cause a current flow in a primary winding of the SMPS and/or one or more second control signals for turning off one or more functional circuit blocks in the controller. In a specific embodiment, the control circuit is configured to turn on the power switch and to turn off one or more functional blocks in response to the detected output load transition.

Another embodiment of the present invention provides a device for controlling a switched mode power supply (SMPS) equipped with a transformer having a primary side winding, a secondary winding, and an auxiliary winding. The device includes a detection circuit for detecting a transition from a heavy output load condition to a light output load condition of the SMPS and a control circuit for turning on a power switch to cause a current flow in the primary side winding upon detection of the transition. In a specific embodiment, the detection circuit comprises a comparator for comparing a feedback voltage with a reference voltage. In another embodiment, the feedback voltage is greater than the reference voltage during the transition.

In some embodiments of the present invention, a switching mode power supply (SMPS) system includes a transformer with a primary winding coupled to a power switch, a secondary winding for providing a regulated output voltage, and a controller. In an embodiment, the controller has a detection circuit having an input for receiving a feedback signal and configured to detect a change in an output load condition, and a control circuit coupled to the detection circuit and configured to output one or more control signals in response to the detected output load transition. The one or more control signals includes a first control signal for turning on a power switch to cause a current flow in a primary winding of the SMPS and/or one or more second control signals for turning off one or more functional circuit blocks in the controller.

The devices and methods according to the present invention can be applied both to a conventional pulse width modulator or a pulse frequency modulator. The circuit and method can also be applied to a continuous current mode or a discontinuous mode of operation. Parts and functions of the present invention include a detector circuit and a logic circuit. In an embodiment of the invention, the detector circuit may preferably be a comparison circuit and the logic circuit may preferably be an AND gate.

The devices and methods according to the present invention may preferably be applied to switched mode power supply systems having a transformer that includes a primary winding, a secondary winding, and an auxiliary winding.

These and other features and advantages of embodiments of the present invention will be more fully understood and appreciated upon consideration of the detailed description of the preferred implementations of the embodiments, in conjunction with the following drawings.

DETAILED DESCRIPTION OF THE INVENTION

Figure 1:
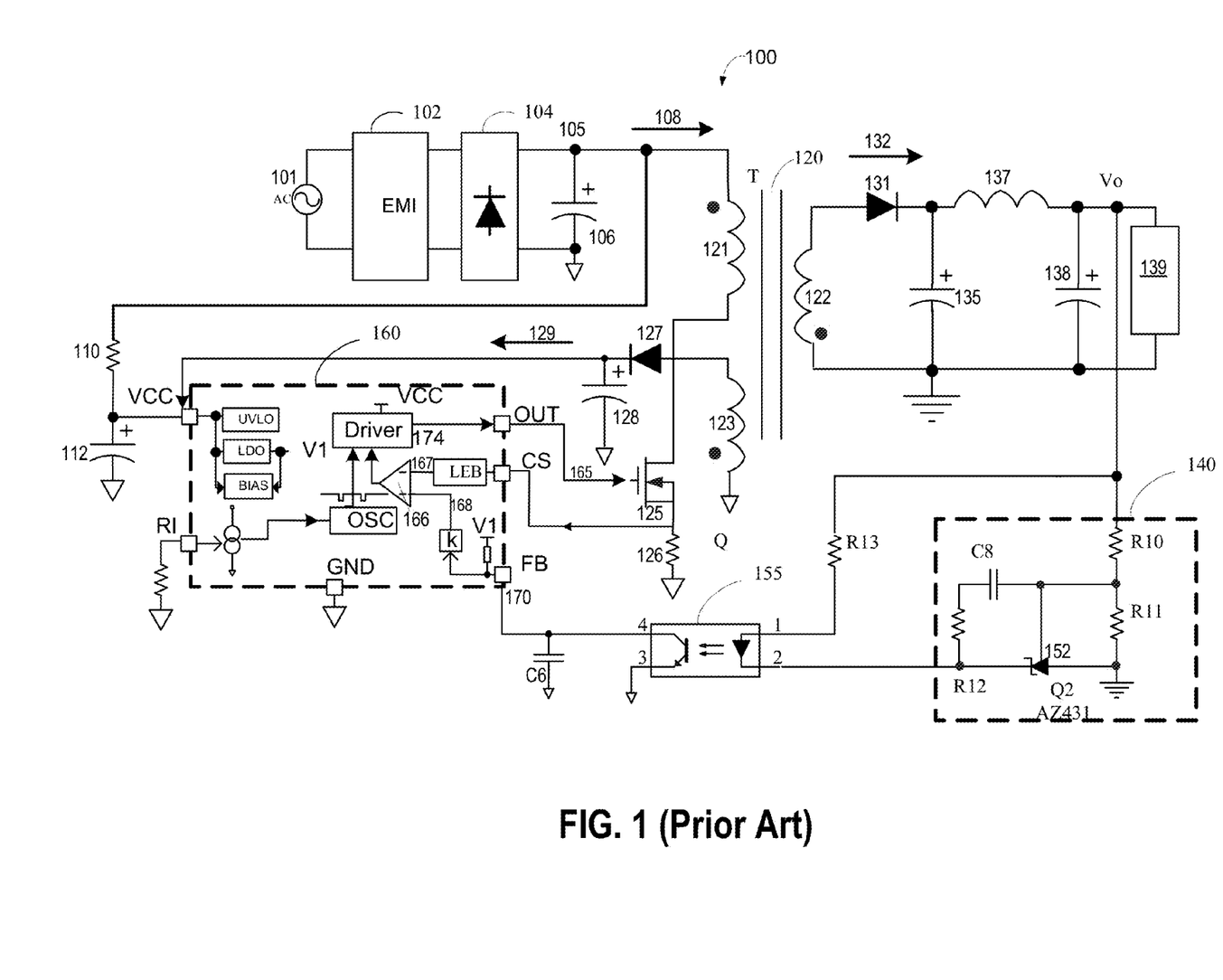
FIG. 1 is a block diagram of a conventional AC/DC switching mode power converter system.

FIG. 1 is a functional block diagram of a conventional AC/DC power converter system 100. As shown, system 100 includes an electromagnetic interference (EMI) filter 102, a rectifier 104, a bypass capacitor 106 that converts the voltage from the AC voltage source 101 to an unregulated DC voltage at node 105. System 100 further includes a transformer 120 having a primary winding 121, a secondary winding 122, and an auxiliary winding 123. Primary winding 121 is coupled to a switch 125 that is switched on and off in response to a drive signal OUT 165. Switch 125 produces a pulsating current 108 across primary winding 121 that transfers an magnetic energy to secondary winding 122 and auxiliary winging 123. On the secondary side, a pulsating current 132 flowing through a rectifier 131 is stored in a capacitor 135 that converts pulsating current 132 into a DC voltage, which is further filtered through an inductor 137 and a capacitor 138 to provide a substantially constant output voltage Vo to an output load 139.

In FIG. 1, auxiliary winding 123 supplies power to a controller 160 through a rectifier 127 and a smoothing capacitor 128. Controller 160 includes an input supply terminal Vcc that receives the unregulated power supply from node 105 through a resistor 110 and a capacitor 112 at start up. Controller 160 also includes an under-voltage lockout (UVLO) block, a low voltage drop out (LDO) block, a dc bias block, etc. The UVLO block is configured to detect the level of supply voltage Vcc and the bias block is configured to generate a second voltage V1 that is used by some other blocks of controller 160. The UVLO and bias blocks are coupled to the supply voltage Vcc. During the startup of controller 160, UVLO block monitors the value of Vcc and prevents controller 160 from generating the internal voltage V1 if the value of Vcc is less than a startup value that is required to initiate operations.

Controller 160 also includes a comparator 166 that compares a current sensing signal 167 with a scaled feedback signal 168. Controller 160 further includes an oscillator (OSC) block that, together with the output of comparator 166, provides the switching output signal OUT 165 to power switch 125 via a driver block 174. Current sense signal 167 senses a current 108 flowing across power switch 125. A leading edge blanking (LEB) block interposed between the current sense signal CS and the input of comparator 166 blanks any current sensing signals that may have high peak magnitudes at the start-up phase for reaching comparator 166. Comparator 166 compares the voltage 167 generated by current sense resistor 126 of primary winding 121 and the scaled voltage 168 of an optocoupler transistor. The compared output signal contains error information of the regulated voltage Vo and serves to set the primary current 108 flowing across power switch 125.

A feedback circuit 140 is coupled to the output voltage Vo to produce, together with an optocoupler 155, a feedback signal 170. Feedback circuit 140 includes resistors R10 and R11 that together form a voltage divider to provide an attenuated voltage of Vo to a shunt regulator 152. Shunt regulator 152 further includes a capacitor C8 and a resistor R12 that form a feedback loop compensation circuit. Shunt regulator 152 together with optocoupler 155 form an isolated feedback circuit to control the primary current 108. A higher current in the optocoupler output transistor results in an decrease in voltage signal FB at the input of controller 160, and thereby reducing the peak value of the primary current 108 that then effectively lowering the regulated output voltage Vo.

Even though power converter system 100 can be used in some applications, it has many limitations. One of the limitations is that it does not handle sudden load change conditions satisfactorily, as described in more detail below.

When output load 139 changes from a heavy load to a light load condition, the power consumption in the secondary winding is reduced dramatically and causes a voltage surge at output voltage Vo. This voltage surge is fed back to controller 160 as a feedback signal FB 170 via optocoupler 155. Comparator 166 then produces an output control signal to driver logic 174 that in turn reduces the primary current 108 by turning off power switch 125.

As controller 160 turns off power switch 125, auxiliary winding 123 stops supplying pulsating current 129 to charge capacitors 112 and 128. Capacitors 112 and 128 are used for providing power input to the VCC pin of controller 160 and are also referred to as the VCC capacitor or the Vcc capacitor. Although controller 160 stops switching power switch 125, it still consumes power because its internal function blocks continue to drain current. This current drainage of internal function blocks causes the voltage supply Vcc from the VCC pin to fall below the cut-off threshold value of UVLO.

When output load 139 changes from a heavy load to a light load condition, output voltage Vo overshoots and saturates shunt regulator 152. In an example, shunt regulator 152 is an adjustable precision shunt regulator AZ431 of BCD Semiconductor Manufacturing Limited. The saturation of shunt regulator 152 causes the voltage at FB to drop to a very low level that, in turn, will disable driver logic 174 of controller 160. Consequently, regulated output voltage Vo and supply voltage Vcc keep decreasing. When output voltage Vo returns back to its original target voltage level, the feedback voltage at input FB of controller 160 still remains low because of the large value of C8 of the frequency compensation circuit. Therefore, power switch 125 remains deactivated and supply voltage Vcc continues to drop below UVLO.

Figure 2:
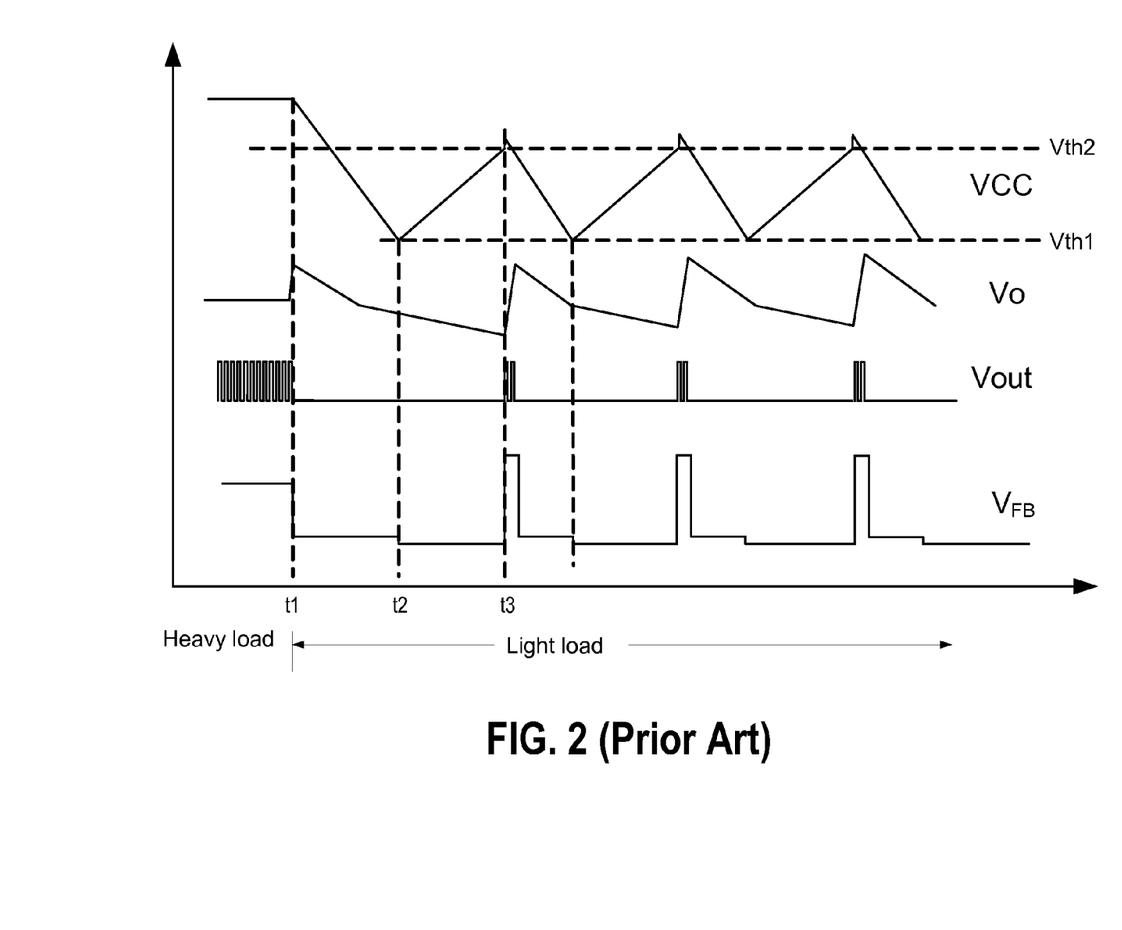
FIG. 2 is a timing diagram showing certain waveforms of the conventional AC/DC switching mode power converter system of FIG. 1.

FIG. 2 is a timing diagram showing waveforms of supply voltage Vcc, output voltage Vo, switching signal OUT 175 and feedback signal FB 170 discussed above. Before time t1, controller 160 operates at a heavy load condition and regulates the value of the output voltage Vo to a target value within the desired range of values. Current 129 charges capacitor 128 through rectifier 127, and Vcc is above a valid operating threshold of UVLO. Driver logic 174 is operational and generates switching pulses OUT to turn on and off power transistor 125 that further maintains the voltage Vcc and output voltage Vo. The LDO block together with the bias generator block generate a second operating voltage v1 that is used by the FB feedback circuit and other internal blocks of controller 160. At t1, output load 139 changes from the heavy load to a light load condition. This load transition causes a voltage surge at Vo. The voltage surge is fed back to controller 160 via optocoupler 155.

Controller 160 reacts to the surge as a sign that the output voltage needs to regulate down, and thus disables power switch 125 to reduce primary current 108. As a result, output voltage Vo and Vcc continue to drop in value. As capacitors 112 and 128 have relatively smaller value than capacitors 135 and 138, voltage Vcc may decrease at a faster rate than that of Vo. At t2, when Vcc drops below a first threshold value Vth1, an internal electronic circuit (not shown) charges Vcc slowly back to a threshold value Vth2. As shown in FIG. 1, the Vcc capacitor is charged through resistor 110 from capacitor 106, thus Vcc will increase. In FIG. 2, Vth1 is a start up threshold voltage of IC and Vth2 is a shut down threshold voltage. At t3, driver logic 174 is operational again and turns on and off power switch 125 that pumps pulsating current 132 via rectifier 131 to capacitor 135 and filter inductor 137 and capacitor 138. The surge of output voltage Vo is again fed back to controller 160 through optocoupler 155, and the process repeats.

According to embodiments of the present invention, several remedies are provided to alleviate the problems described above. For example, in order to prevent Vcc from dropping below UVLO when the output operation mode changes from heavy load to light load, a large bypass capacitor at Vcc may be utilized. However, a large bypass capacitor will increase the system startup time and cost. Another alternative solution is to reduce the current drain of controller 160 by detecting a load condition change at the output and by switching off certain functional blocks of the controller to reduce power consumption by the controller. Still another alternative include detecting a load condition change at the output and turning on the power switch to provide more power.

The following equations provide relationships between the secondary output power and input current for both the continuous current mode (CCM) and discontinuous current mode (DCM):

$$P = V_{AV} * I_{AV} \quad (1)$$

$$I_{P\text{-}PEAK} = \frac{I_O}{N_t(1-D_{ON})} + \frac{V_{IN} \cdot D_{ON}}{f_s \cdot L}, D_{ON} = \frac{N_t V_O}{N_t V_O + V_{IN}} \quad (CCM) \quad (2)$$

$$I_{P\text{-}PEAK} = I_{RAMP} = \sqrt{\frac{2 \cdot P_O}{f_s \cdot L}} = \frac{V_{IN} \cdot D_{ON}}{f_s \cdot L} \quad (DCM) \quad (3)$$

$$I_{P\text{-}AV} = \frac{I_O \cdot D_{ON}}{N_t(1-D_{ON})} + \frac{V_{IN} \cdot D_{ON}^2}{2 \cdot f_s \cdot L}, D_{ON} = \frac{N_t V_O}{N_t V_O + V_{IN}} \quad (CCM) \quad (4)$$

$$I_{P\text{-}AV} = \frac{I_{P\text{-}PEAK}}{2} \cdot D_{ON} = \sqrt{\frac{2P_O}{f_s \cdot L}} \cdot D_{ON} = \frac{V_{IN} \cdot D_{ON}^2}{2 \cdot f_s \cdot L} \quad (DCM) \quad (5)$$

$$D_{ON} = \frac{N_t V_O}{V_{IN}} \cdot \sqrt{\frac{2 \cdot L \cdot f_s}{R_L}} \quad (DCM) \quad (7)$$

where $V_{AV}$=average $V_{AC}$; $V_{IN}$=1.414 $V_{AV}$; $I_{AV}$=average $I_{AC}$; $T_{P\text{-}AV}$=average $I_{AC}$; L=inductance of the primary winding; $N_t$=$N_p/N_s$ (ratio between primary and secondary windings); $f_s$=switching frequency, $P_O$=$V_O*I_O$ (secondary output power), and $R_L$=the output load.

According to some embodiments of the present invention, the instability shown in FIG. 2 can be reduced by increasing the charging rate of Vcc and/or reducing the current drain of the controller.

Figure 3:
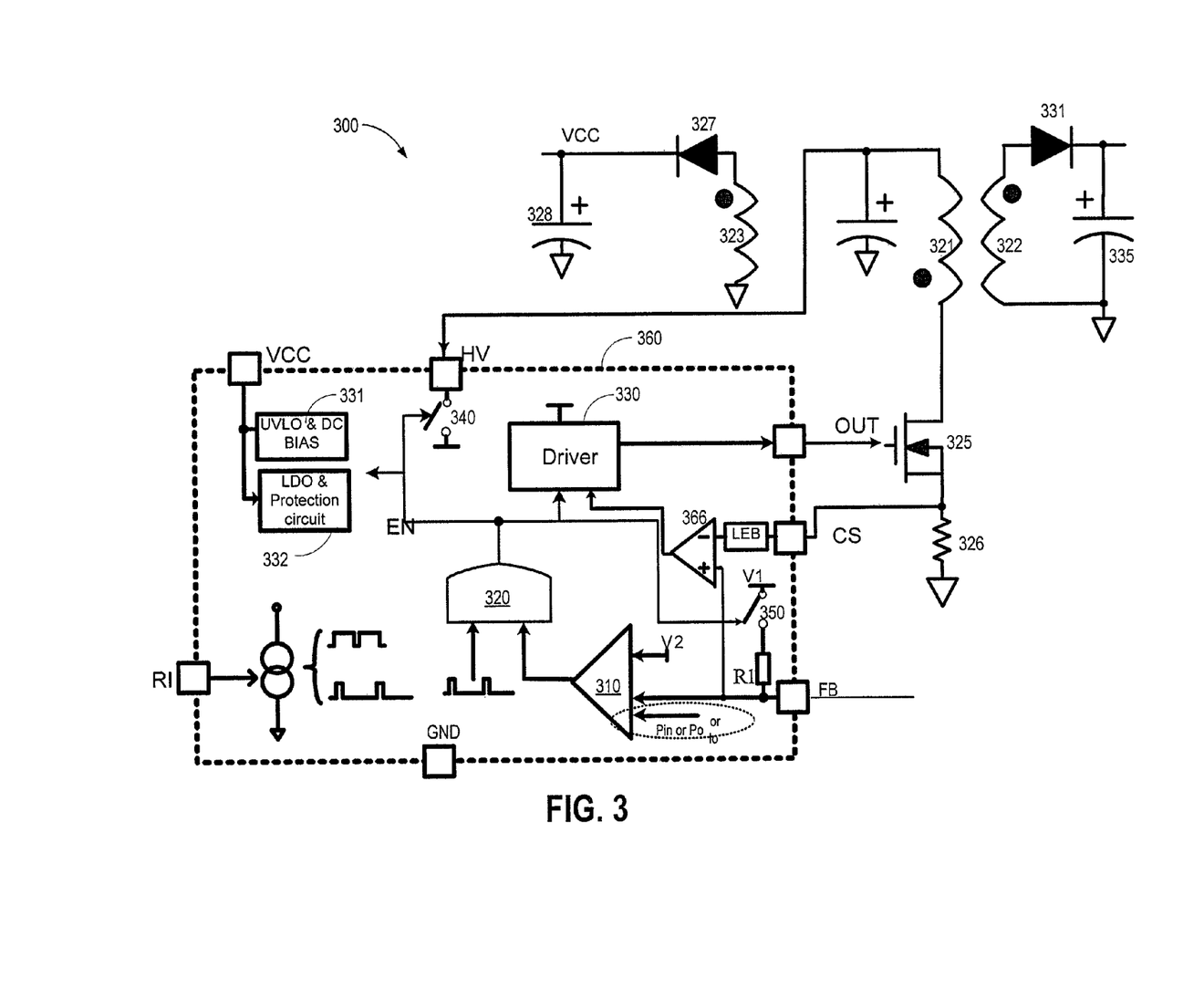
FIG. 3 is a simplified functional block diagram of a switching mode power supply including selected circuit blocks of a controller in accordance with a first embodiment of the present invention.

FIG. 3 is a simplified functional block diagram of a switching mode power supply 300 including selected circuit blocks of a controller 360 in accordance with a first embodiment of the present invention. Some of the circuit blocks are similar to those shown in FIG. 1 and are omitted here to simplify the drawing. As shown, switching mode power supply 300 includes a transformer having a primary winding 321, a secondary winding 322, and an auxiliary winding 323. Switching mode power supply 300 further includes a controller 360. In one embodiment, controller 360 is implemented using a very high voltage integrated circuit (VHVIC) technology to allow a direct coupling to the high voltage source such as the primary winding 321. Controller 360 can derive its internal power supplies from the high voltage input HV. Controller may also receive a power supply from a secondary winding through rectifier 327 and a capacitor 328. At power-on or start up phase, capacitor 328 is charged through the high voltage source to provide a voltage source to controller 360. Once Vcc reaches a voltage threshold value, a UVLO & DC BIAS block 331 enables a LDO & Protection circuit block that provides protection and internal voltage supplies to controller 360. Controller 360 turns on and off a power switch 325 coupled to primary winding 321 to deliver energy to secondary winding for maintaining a target voltage output Vo (not shown). Hardware implementation at the secondary winding side can be similar to the circuitry shown in FIG. 1 including the shunt regulator 152 and opto-coupler 155. In one embodiment, controller 360 includes a comparator 310 that compares a feedback signal 370 with a reference voltage V2. Comparator 310 produces a logic signal that may be used to disable or enable some or all functional blocks of controller 360. In an embodiment, the output of comparator is coupled with a logic gate 320. For example, if feedback signal 370 is below reference voltage V2, i.e., if the output voltage Vo at the secondary side is higher than a target output voltage range, the output of comparator 310 is logic low and the output of logic gate 320 is asserted low, thus disables UVLO block 331, LDO block 332, driver logic block 330. In another embodiment, the output of logic gate 320 also disables switch 340 that couples the high voltage of the primary winding to the internal Vcc of the controller 360 and switch 350 that couples an internal voltage V1 to feedback signal 370 via a resistor R1. By disabling certain functional blocks within controller 360, the drain current of controller will be reduced and the voltage Vcc will drop much slower.

Figure 4:
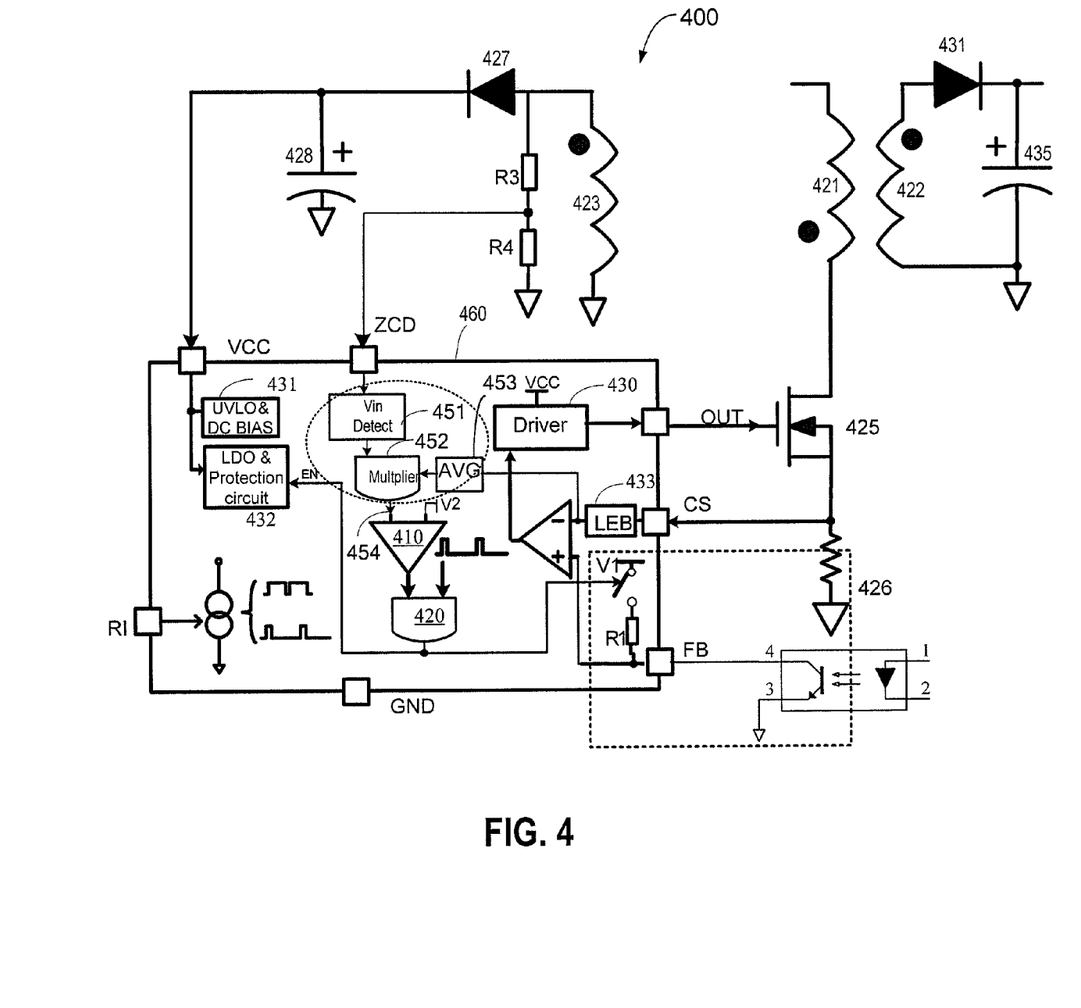
FIG. 4 is a simplified block diagram illustrating a switching mode power supply including selected functional blocks of a controller in accordance with a second embodiment of the present invention.

FIG. 4 is a simplified block diagram illustrating a switching mode power supply 400 including selected functional blocks of a controller 460 in accordance with a second embodiment of the present invention. It is understood that controller 460 may include circuit blocks described above in connections with FIGS. 1 and 3. Switching mode power supply 400 includes a transformer having a primary winding 421, a secondary winding 422, and an auxiliary winding 423. Comparator 410 is coupled with a feedback signal ZCD that is derived of a resistive divider R3/R4 coupled to auxiliary winding 423. Feedback signal ZCD reflects both the change of the regulated output voltage Vo and input voltage (node 105). ZCD can further be scaled by multiplying with an average value 453 of the current sensing voltage CS that reflects the current flowing across power switch 425. The scaled product 454 indicating the output power is then compared with a reference voltage V2 at comparator 410, whose output is coupled to logic circuit 420 for providing control signals. Dependent on the result of the comparison at comparator 410, these control signals are used to disable some functions of controller 460 to reduce the current drain and to obtain a slower Vcc discharge. For example, one such functions is the LDO & Protection circuit block. In another example, the control signals can also be used to control the feedback path of the FB signal.

Figure 5:
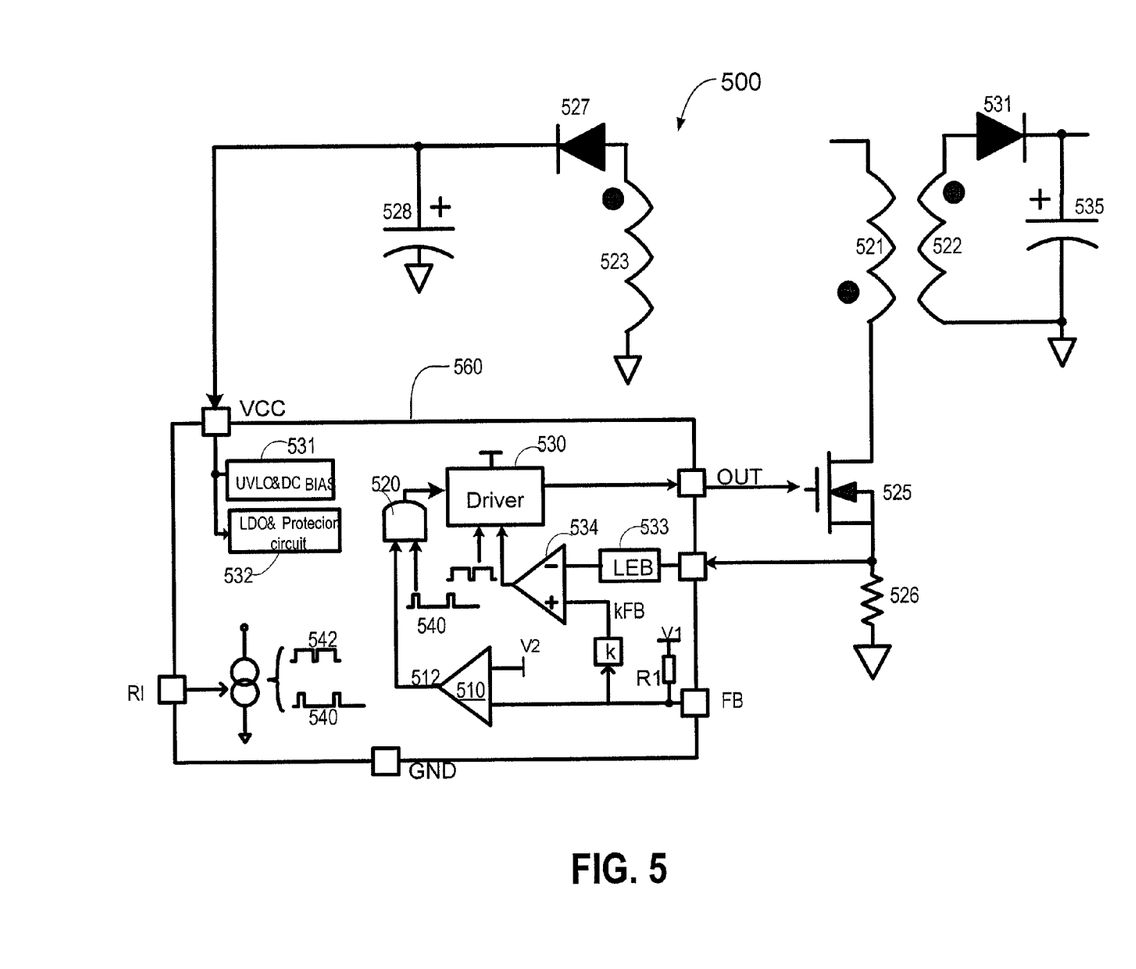
FIG. 5 is simplified block diagram of a switching mode power supply including selected functional blocks of a controller for in accordance with a third embodiment of the present invention.

FIG. 5 is simplified block diagram of a switching mode power supply 500 including selected functional blocks of a controller 560 for in accordance with a third embodiment of the present invention. It is understood that controller 560 may include circuit blocks described above in connections with FIGS. 1, 3, and 4. As shown in FIG. 5, switching mode power supply 500 includes a transformer having a primary winding 521, a secondary winding 522, and an auxiliary winding 523. Comparator 510 is coupled with a feedback signal FB that is then compared with a reference voltage V2. If the voltage of feedback signal FB is lower than reference voltage V2, comparator will produce a positive signal 512 at its output. Positive signal 512 is coupled to an AND gate 520 whose other input is coupled to a clock signal 540. Clock frequency 540 is used to enable a driver logic block 530 to turn on and off a power switch 525. By turning on and off power switch 525, the voltage supply Vcc of controller 560 will be maintained above a voltage threshold level above UVLO. In other embodiment, this circuit can be easily adapted to other applications, e.g., to an accelerated buildup of Vcc for the controller at startup.

Feedback signal FB is further coupled with a first input of a comparator 534 via a scale circuit k. Comparator 534 has a second input coupled with a current sensing resistor 526 via a LEB circuit 533. Current sensing resistor produces a voltage at the CS input of controller 560. In the normal operating mode, comparator 534 compares the voltage CS (after a blanking period at startup) at the current sensing resistor 526 and a scaled feedback voltage kFB to produce an error information. The error information is then used to activate driver logic circuit 430 to turn on and off power switch for regulating the output voltage Vo.

Figure 6:
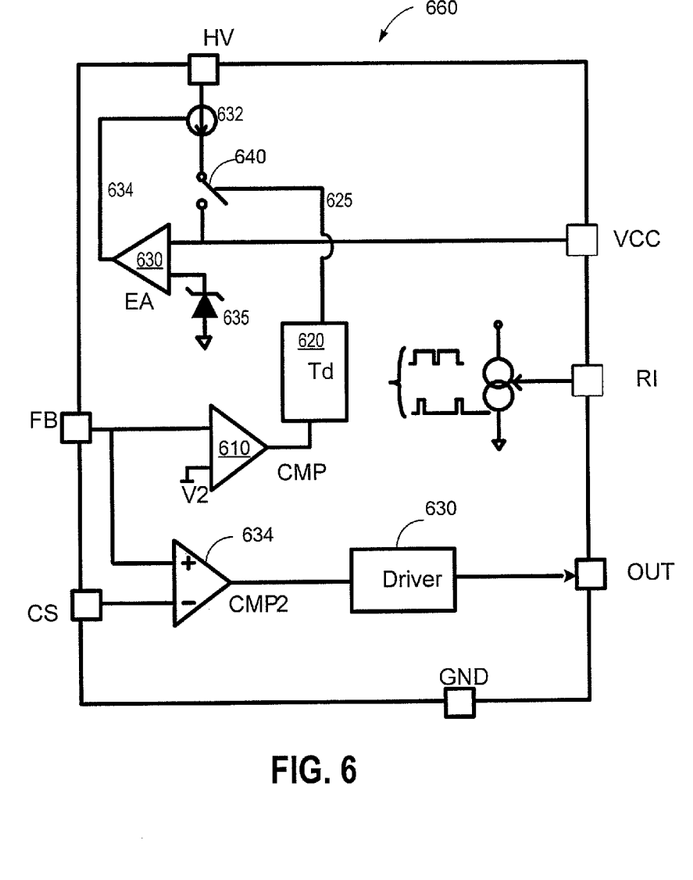
FIG. 6 is a simplified functional block diagram illustrating selected blocks of a SMPS controller for a switching mode power supply in accordance with a fourth embodiment of the present invention.

FIG. 6 is a simplified functional block diagram illustrating selected blocks of a controller 660 for a switching mode power supply in accordance with a fourth embodiment of the present invention. It is understood that controller 660 may include functional blocks described above, depending on the embodiment. In this embodiment, controller 660 includes a comparator 610 that receives a feedback signal FB and compares the FB signal with a reference voltage V2. The result of the comparison is delayed in a delay circuit 620 to produce a delayed control signal 625. Controller 660 also includes an input HV for receiving a high voltage source that may be an unregulated direct current voltage tapped at a primary winding (not shown). Controller 600 further includes a current source 632 that is controlled by an error amplifier 630. Error amplifier 630 compares a voltage Vcc with a reference voltage V1 and produces an error control signal 634. Error signal 634 is then used to control current source 632. A switch 640 is interposed between voltage Vcc and current source 632 and is turned on and off by the delayed control signal 625. As a consequence, the decrease of the Vcc when a surge at the output voltage Vo during a light load condition can be slowed down or even compensated by turning of switch 640. In an embodiment, switch can be an MOS transistor, a transmission gate, or a semiconductor circuitry.

Figure 7:
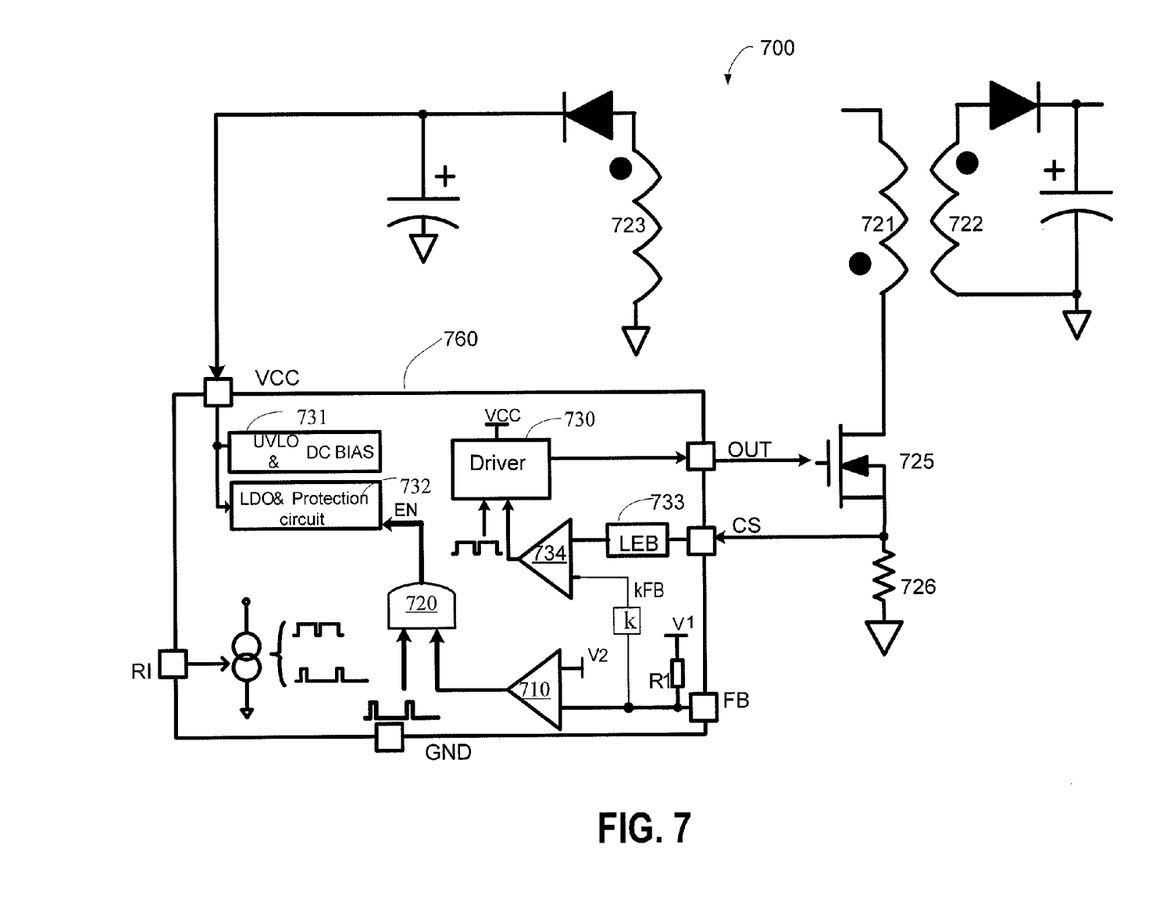
FIG. 7 is a functional block diagram of a controller for a switching mode power supply in accordance with a fifth embodiment of the present invention.

FIG. 7 is a simplified functional block diagram of a switching mode power supply 700 including selected circuit blocks of a controller 760 for in accordance with a fifth embodiment of the present invention. It is understood that controller 760 may include functional blocks described above, depending on the embodiment. As shown in FIG. 7, controller 700 includes a comparator 734 that compares a scaled feedback signal kFB with a current sensing signal CS. Comparator 734 is configured to regulate an output voltage Vo to a target value within a desired range of values by turning on and off a power switch 725. Feedback signal FB is further coupled to a comparator 710 that compares feedback signal FB with a reference voltage V2. Based on the result of the comparison, a logic gate 720 may disable some functional blocks of controller 700 to reduce the current drain, in order to slow down the rate of the Vcc voltage drop and thereby minimizing instability at voltage Vcc and surges at the regulated output voltage when the output load changes from a heavy load to a light load. In an exemplary embodiment, LDO and protection block 732 is disabled to reduce the power consumption of controller 760. It is appreciated that other function blocks may also be disabled to save further power consumption of controller 700 and obtain a slower drop rate of Vcc.

Figure 8:
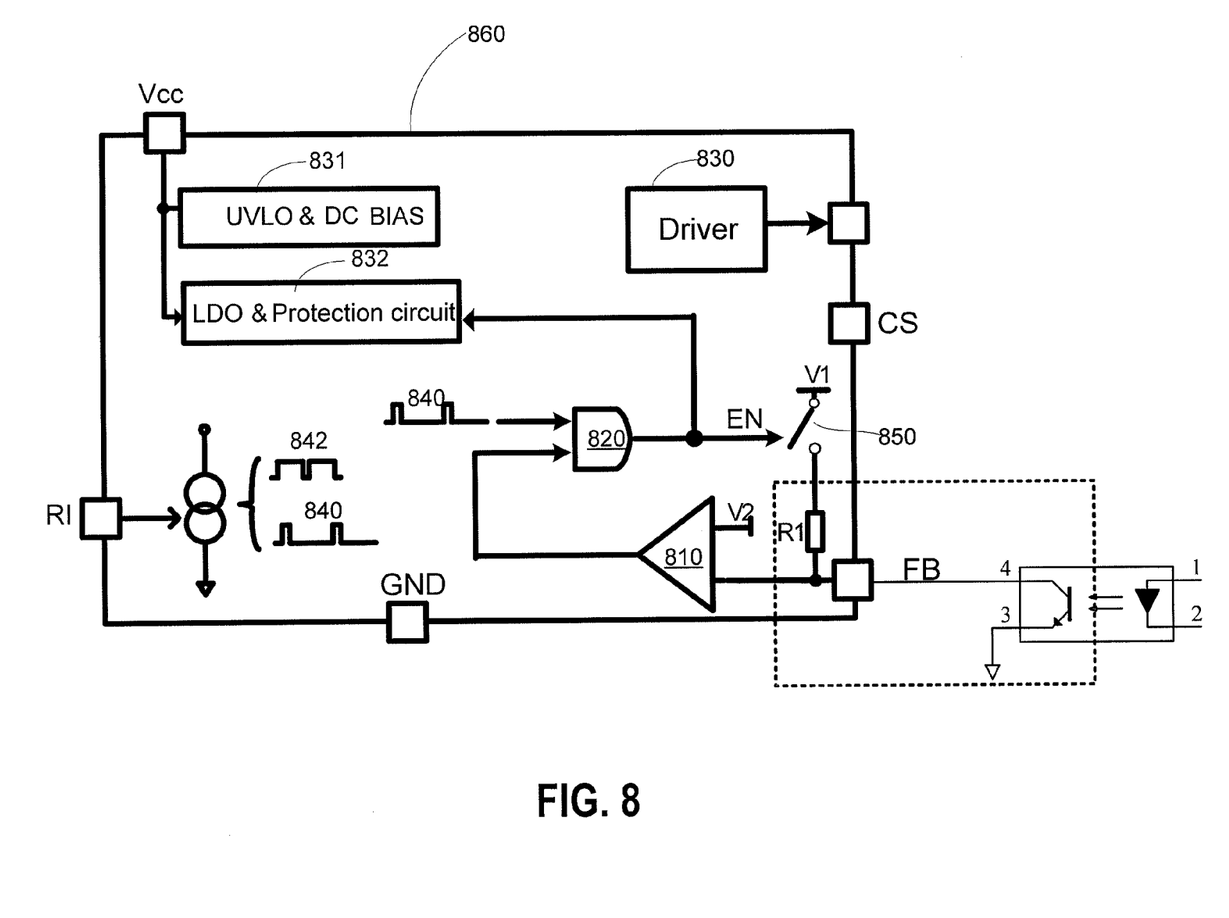
FIG. 8 is a functional block diagram illustrating selected functional blocks of a controller for a switching mode power supply in accordance with a sixth embodiment of the present invention.

FIG. 8 is a functional block diagram illustrating selected functional blocks of a controller 860 for a switching mode power supply in accordance with a sixth embodiment of the present invention. It is understood that controller 860 may include functional blocks described above, depending on the embodiment. In this embodiment, controller 860 includes a comparator 810 that compares a feedback signal with a reference voltage V2. Based on the result of the comparison, a gate 820 may disable certain functional blocks of controller 860 according to an oscillation frequency 840. In an exemplary embodiment, the feedback input can be disabled by turning off a switch 850. In an embodiment, disabling the feedback input prevents a sink current from flowing across resistor R1 out of controller 860.

Figure 9:
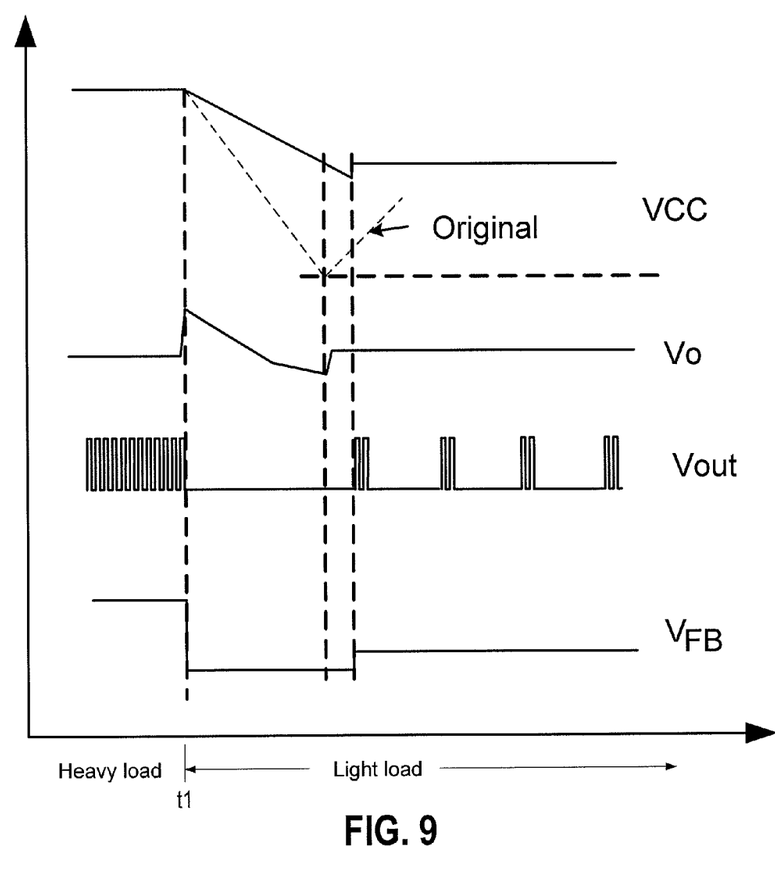
FIG. 9 shows voltage waveforms of a switching mode power supply according to embodiments of the present invention.

FIG. 9 shows voltage waveforms of a switching mode power supply according to embodiments of the present invention. Before time t1, the switching mode power supply is operating with a heavy load at the output. At t1, the output load condition changes from the heavy load to a light load. This load change causes a voltage surge at Vo that is fed back to the controller via its FB input. The voltage surge is detected by a voltage surge detector, which, as described in connection with FIGS. 3-8 above, disables certain functional blocks of the controller to reduce the current drain and slow down the drop rate of Vcc. As a result, the waveforms associated with Vcc, Vo, and the feedback signal FB do not show pronounced instability as in the case of a conventional controller (See FIG. 2). And the supply voltage Vcc remains in a valid range that will not activate the under voltage lockout function of the controller.

In view of the achieved improvements provided by the illustrative examples disclosed above, it is evident that embodiments of the present invention not only provide devices and methods to minimize instability of the controller voltage supply and the regulated output voltage, but also can provide circuits and methods to decrease power dissipation of the controller when the output condition changes.

While the present invention is described with specific embodiments, it is evident that many alternatives and variations will be apparent to those skilled in the art. For example, the disclosed devices and methods of the present invention may also apply to converters with pulse width modulation or pulse frequency modulation, and they may also apply to many other functional blocks such as over current protection block, over temperature block, and many other functional blocks that are not disclosed above.

What is claimed is:

1. A controller for a switched mode power supply (SMPS) equipped with a transformer having a primary side winding, a secondary winding, and an auxiliary winding, the controller comprising:
a first control circuit for providing a substantially constant output voltage to an output load, the first control circuit including a first comparator;
a detection circuit including a second comparator configured for comparing a feedback voltage with a reference voltage for detecting a transition from a first output load condition to a second output load condition of the SMPS; and
a second control circuit coupled to the detection circuit and being configured to output two or more control signals in response to the detected output load transition from the first output load condition to the second output load condition, the two or more control signals including:
a first control signal for turning on a power switch to cause a current flow in a primary winding of the SMPS; and
one or more second control signals for turning off one or more functional circuit blocks in the controller, said one or more functional blocks including one or more of a UVLO (under voltage lockout) block and a driver logic block.

2. The controller of claim 1 wherein the second control circuit is configured to turn on the power switch and to turn off one or more functional blocks in response to the detected output load transition.

3. The controller of claim 1 wherein an output of the comparator is coupled to an AND gate.

4. The controller of claim 1 wherein an output of the comparator is coupled to a driver that is coupled to the power switch.

5. The controller of claim 1 wherein an output of the comparator is configured to turn on or off a first switch, the first switch being coupled between a HV terminal and a Vcc terminal, said HV terminal being coupled to a high voltage source or the primary side winding.

6. The controller of claim 1 wherein an output of the comparator is configured to turn on or off a second switch, the second switch being coupled to a feedback terminal through a first resistor, the second switch also coupled to one or more of the following circuit blocks:
an under-voltage lockout (UVLO) circuit;
a DC bias circuit; and
an enable terminal of a protection circuit.

7. The controller of claim 1 wherein an output of the comparator is connected directly to one or more of the following circuit blocks:
an under-voltage lockout (UVLO) circuit;
a DC bias circuit; and
an enable terminal of a protection circuit.

8. The controller of claim 1 further comprising an input voltage detection circuit having an input coupled to a sample voltage from another winding and an output coupled to a multiplier, the multiplier being coupled to a current sense terminal which samples a primary side current, an output of the multiplier being coupled to the comparator.

9. The controller of claim 1 wherein the transition from the first output load condition to the second output load condition is associated with a voltage surge in a feedback signal.

10. The controller of claim 1 wherein the control signal maintains its logic state until a load transient occurs between the first and second output load conditions.

11. The controller of claim 1 wherein the one or more the functional circuit blocks comprise a dc bias generator block.

12. The controller of claim 1 wherein the one or more functional circuit blocks comprise a low drop out circuit block.

13. The controller of claim 1 wherein the disabling of the one or more functional circuit blocks is performed by turning off electronic switches, wherein each switch is associated with the one or more of the functional circuit blocks.

14. A device for controlling a switched mode power supply (SMPS) equipped with a transformer having a primary side winding, a secondary winding, and an auxiliary winding, the device comprising:
a detection circuit for detecting a transition from a heavy output load condition to a light output load condition of the SMPS, the detection circuit including a comparator configured for comparing a feedback voltage with a reference voltage for detecting a transition from the heavy output load condition to the light output load condition of the SMPS; and
a control circuit for turning on a power switch to cause an increased current flow in the primary side winding upon detection of the transition from the heavy output load condition to the light output load condition.

15. The device of claim 14 wherein the feedback voltage is greater than the reference voltage during the transition.

16. A switching mode power supply (SMPS) system comprising:
a transformer with a primary winding coupled to a power switch;
a secondary winding for providing a regulated output voltage; and
a controller, the controller having:

a first control circuit for providing a substantially constant output voltage to an output load, the first control circuit including a first comparator;

a detection circuit having an input for receiving a feedback signal and configured to detect a change in an output load condition, the detection circuit including a second comparator configured for comparing a feedback voltage with a reference voltage for detecting a transition from a first output load condition to a second output load condition of the SMPS; and a second control circuit coupled to the detection circuit and being configured to output one or more control signals in response to a detected output load transition, the one or more control signals including:

one or more second control signals for turning off one or more functional circuit blocks in the controller, said one or more functional blocks including one or more of a UVLO (under voltage lockout) block and a driver logic block.

17. The switching mode power supply of claim 16 wherein the detection circuit comprises a comparator that compares the feedback signal with a reference voltage.

18. The switching mode power supply of claim 16 wherein an output of the comparator is configured to turn on or off a second switch, the second switch being coupled to a feedback terminal through a first resistor, the second switch also coupled to one or more of the following circuit blocks:

an under-voltage lockout (UVLO) circuit;
a DC bias circuit; and
an enable terminal of a protection circuit.

* * * * *